United States Patent
McGrath et al.

(10) Patent No.: US 7,456,380 B2
(45) Date of Patent: Nov. 25, 2008

(54) ASYMMETRICAL MICROLENSES ON PIXEL ARRAYS

(75) Inventors: R. Daniel McGrath, Pittsford, NY (US); Ronald W. Wake, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/253,915

(22) Filed: Oct. 18, 2005

(65) Prior Publication Data

US 2006/0273239 A1 Dec. 7, 2006

Related U.S. Application Data

(60) Provisional application No. 60/686,106, filed on Jun. 1, 2005.

(51) Int. Cl.
*H01L 27/00* (2006.01)
(52) U.S. Cl. ............ 250/208.1; 257/294; 257/432; 250/214.1; 250/216; 359/619
(58) Field of Classification Search .......... 250/208.1, 250/214.1, 216; 257/294, 432; 359/619, 359/628; 348/333.08
See application file for complete search history.

(56) References Cited

U.S. PATENT DOCUMENTS

| 5,536,455 | A | 7/1996 | Aoyama et al. |
| 6,709,796 | B2 * | 3/2004 | Irving et al. ............ 430/21 |
| 2003/0210462 | A1 | 11/2003 | Freese et al. |
| 2005/0078377 | A1 | 4/2005 | Li et al. |

FOREIGN PATENT DOCUMENTS

| DE | 195 45 484 | 6/1997 |
| WO | WO 02/49366 | 6/2002 |

* cited by examiner

*Primary Examiner*—Kevin Pyo
(74) *Attorney, Agent, or Firm*—Peyton C. Watkins

(57) ABSTRACT

An image sensor includes a plurality of photosensitive sites; a plurality of asymmetrical-shaped microlenses positioned spanning the photosensitive sites; wherein incoming light is directed in a predetermined direction by an asymmetrical surface of the asymmetrical-shaped microlenses onto the photosensitive sites for capturing the light in a substantially uniform manner.

12 Claims, 7 Drawing Sheets

ASYMMETRICAL MICROLENSES ON PIXEL ARRAYS

CROSS-REFERENCE TO RELATED APPLICATIONS

This is a 111A application of Provisional Application Ser. No. 60/686,106, filed Jun. 1, 2005.

FIELD OF THE INVENTION

The invention relates generally to the field of microlenses spanning photosensitive sites of an image sensor and, more particularly, to asymmetrical microlenses spanning the photosensitive site that captures incident light in a substantially uniform manner.

BACKGROUND OF THE INVENTION

Referring to FIG. 1, image sensors 10 typically include pixels 20 having a photosensitive area or photodiode 30 for capturing incident light and associated circuitry 40 adjacent the photosensitive area for processing and the like. In some cases, pixels 20 of an image sensor 10 are arranged asymmetrically to maximize the performance of the pixel while accommodating the associated circuitry 40. However, in this case, four of the pixels 20 typically form a regular grid pattern forming a supercell 50. Referring to FIG. 2, a microlens 60 is positioned spanning and spatially centered over the "photosensitive portion" of the pixels 20. Referring to FIG. 3, alternatively, microlenses 65 may be positioned spanning and centered over the entire "pixel" creating a regular array of microlenses.

Although the prior art arrangement of microlens 60 as in FIG. 2 is satisfactory, it includes drawbacks in that the microlens 60 is a small fraction of the area of the pixel, and therefore the photodiode 30 captures a small fraction of the incident light.

Still further, although the prior art arrangement of microlenses 65 (as in FIG. 3) over asymmetrically positioned pixels is satisfactory, they also include drawbacks. Referring to FIG. 4, as long as photodiodes 30 are symmetric with respect to the microlens 60 such as being centered in the pixel, then the performance of all pixels degrade in the same manner as the angle of the incident light is increased. As shown in FIG. 5, light passing (indicated by the dashed lines) through the microlenses 65 at certain angles is not directed onto the photodiode 30 causing undesirable degradation of the captured image when the photodiodes 30 are not arranged symmetrically with the microlens.

Consequently, a need exists for improved focusing of light on asymmetrical positioned pixels.

SUMMARY OF THE INVENTION

The present invention is directed to overcoming one or more of the problems set forth above. Briefly summarized, according to one aspect of the present invention, the invention resides in an image sensor comprising (a) a plurality of photosensitive sites; (b) a plurality of asymmetrical-shaped microlenses positioned spanning the photosensitive sites; wherein incoming light is directed in a predetermined direction by an asymmetrical surface of the asymmetrical-shaped microlenses onto the photosensitive sites for capturing the light in a substantially uniform manner.

These and other aspects, objects, features and advantages of the present invention will be more clearly understood and appreciated from a review of the following detailed description of the preferred embodiments and appended Claims, and by reference to the accompanying drawings.

ADVANTAGEOUS EFFECT OF THE INVENTION

The present invention has the advantage of increasing the light gathering capacity of a pixel array and eliminating artifacts that occur when the incident angle of illumination is varied or varies. It is also includes the advantage of permitting more design freedom for efficient use of the pixel space.

DETAILED DESCRIPTION OF THE INVENTION

Figure 1:
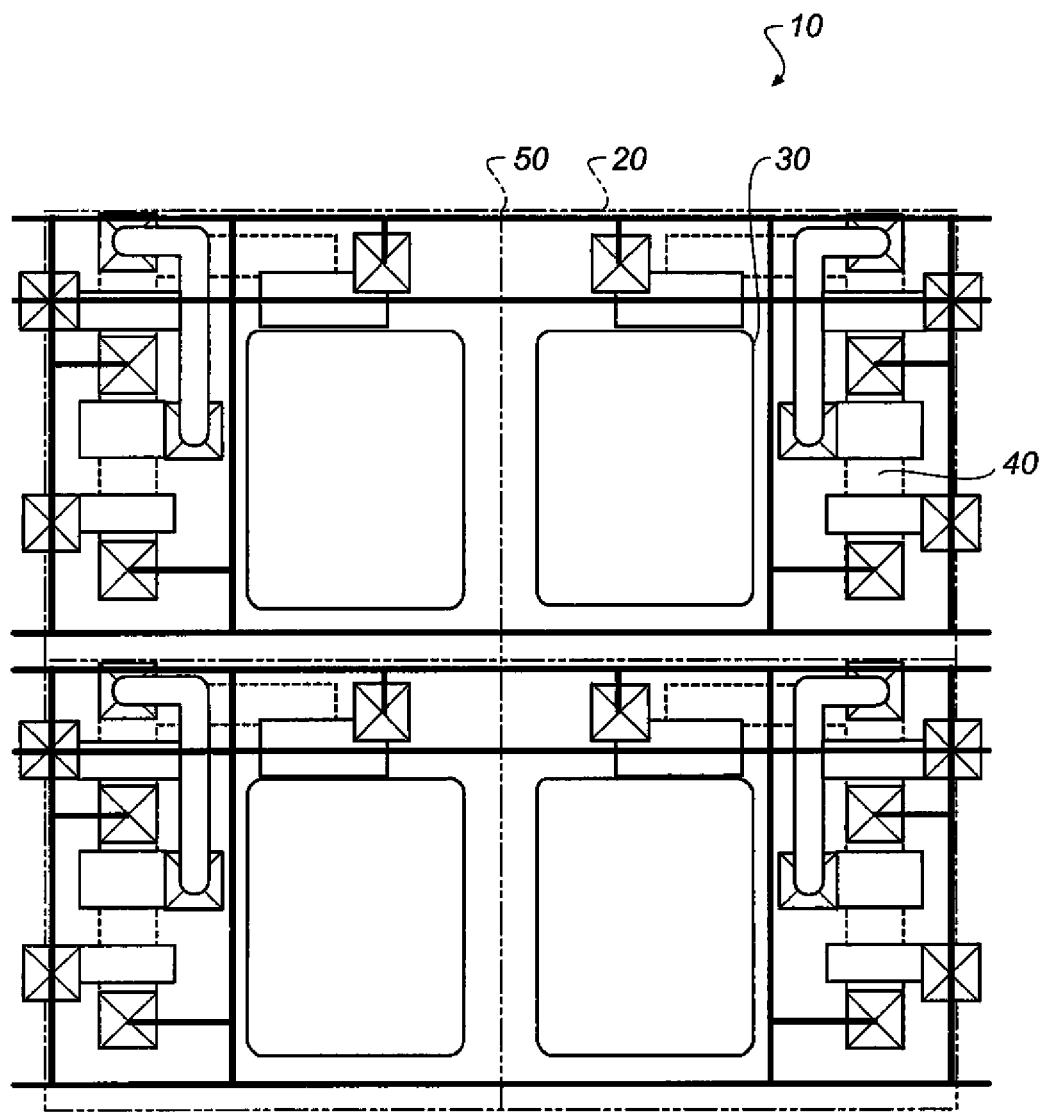
FIG. 1 is a top view of a prior art pixel array with apertures in an asymmetrical arrangement.
Figure 2:
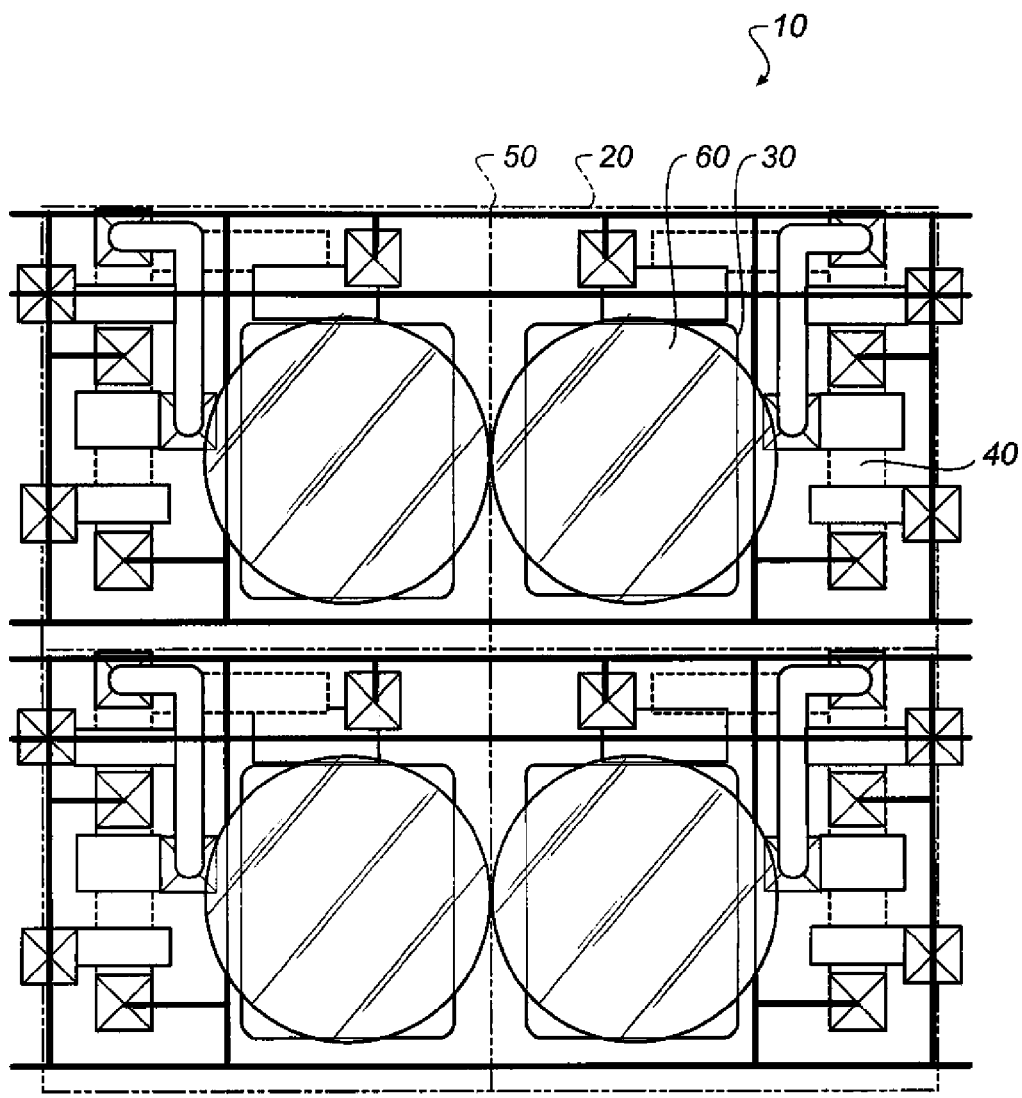
FIG. 2 is a top view of FIG. 1 with microlenses spanning and centered over the photodiodes of array of pixels.
Figure 3:
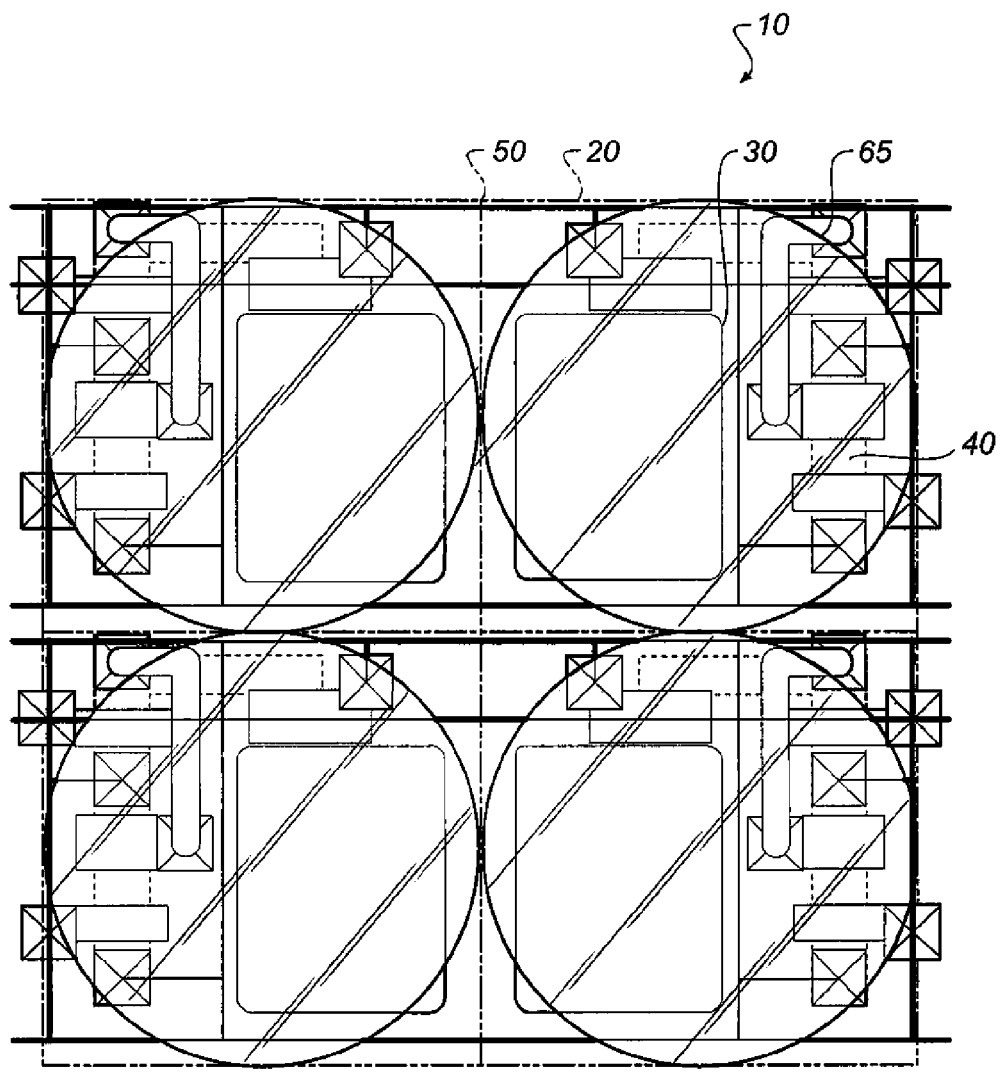
FIG. 3 is a top view of FIG. 1 with microlenses spanning and centered over the pixels in the array.
Figure 4:
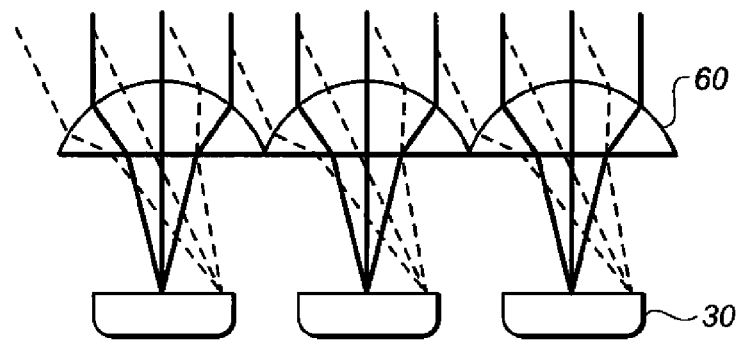
FIG. 4 is a side view of a prior art pixel array with a symmetric arrangement of photodiodes and microlenses.
Figure 5:
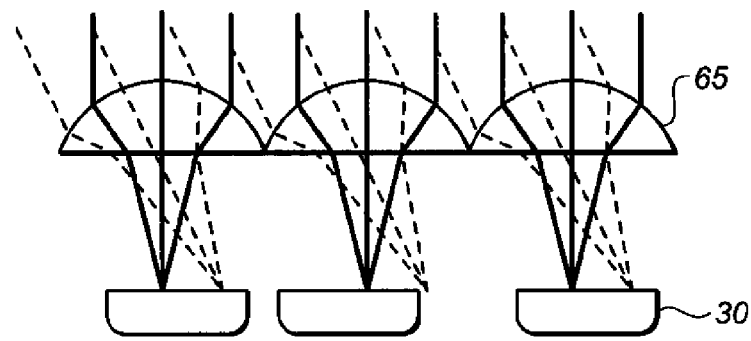
FIG. 5 is a side view of a prior art pixel array with a symmetric microlenses and asymmetrical arrangement of photodiodes.
Figure 6:
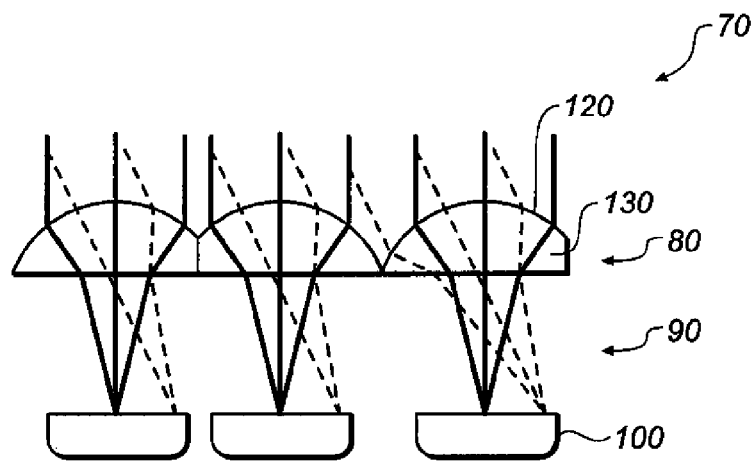
FIG. 6 is a side view of the pixel array of the present invention with an asymmetric arrangement of photodiodes and an asymmetric arrangement of microlenses (the optical axis of each microlens is aligned with the center of the photodiode)
Figure 7:
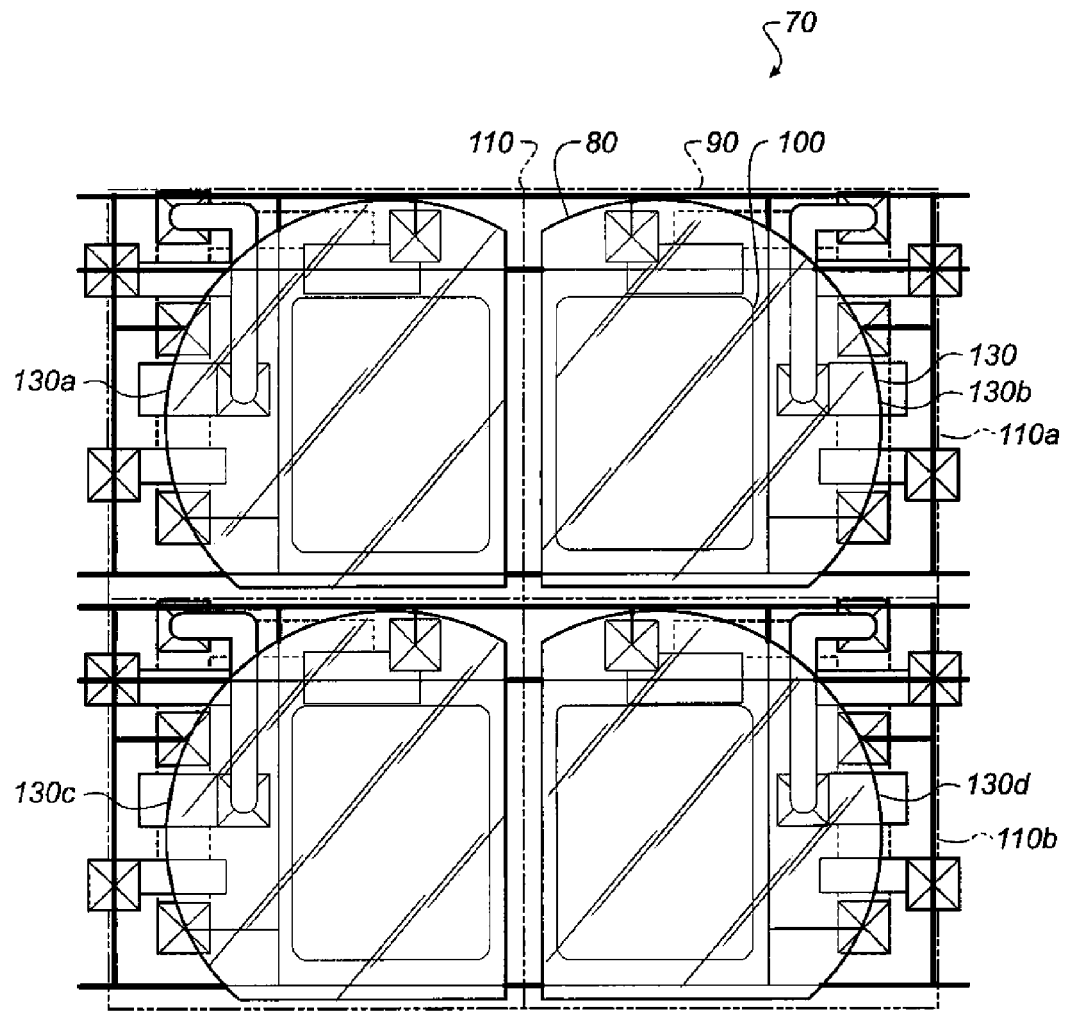
FIG. 7 is a top view of FIG. 6.

Referring to FIGS. 6 and 7, there are shown a side view and a top view of an image sensor 70 having a plurality or array of microlenses 80 of the present invention positioned respectively spanning a plurality of pixels 90 each having a photosensitive area or photodiode 100. As stated above, the pixels 90 are arranged asymmetrically. However, it is noted that pixels are grouped together so as to form an array of supercells 110. It is noted that only two supercells 110a and 110b each comprising two pixels is shown for clarity in FIGS. 6 and 7. For completeness, it is noted that the photosensitive areas 100 are disposed along a top portion of a silicon substrate, as is well known in the art. The pixels 90 are arranged so that by design they include an asymmetrical arrangement of the photosensitive areas 100. An optical surface 120 of the microlens 130 is asymmetrically shaped. Prior art microlens (60 and 65) are substantially hemispherically shaped. As seen more clearly in FIG. 6, the microlens 130 of the present invention is substantially a truncated hemisphere that allows an asymmetrical arrangement. In other words, the each microlens 130 includes a substantially arcuate-shaped portion along a peripheral edge and includes two substantially straight portions positioned substantially perpendicular to each other along a remaining edge. For clarity, it is noted that the present invention microlens 130 has been trimmed along one or more edges as compared to the prior art microlens (60 and 65). This aligns the optical axis of the microlens 130 with the photodiode 100. Referring solely to FIG. 7, it is noted that, within the two pixels comprising the supercell 110, the microlenses 130 abut each other so that each individual microlens (130a, 130b, 130c and 130d) is symmetrical with respect to an imaginary y-axis of the supercell 110, but still not symmetrical within any individual pixel 90 as stated hereinabove. In other words, each two-pixel supercell 110 includes two asymmetrical-shaped microlenses 130 grouped spanning a supercell 110 and a pair of straight portions, one from each microlens, are positioned so that a peripheral portion formed by the two microlenses is two arcuate-shaped edges and two straight edges.

The above-described pixel array functions so that incoming light that passes through a microlens 130 is directed substantially uniformly, that is consistently from pixel to pixel, onto the photodiode 100, as illustrated by the solid and dashed lines, even though the spacing (i.e., distance) from photodiode to photodiode is not constant or is varying. In other words, the light is distributed substantially consistently across the photodiode 100 independent of which pixel within the supercell it is, with light passing from substantially directly overhead being directed substantially consistently onto a portion of the photodiode 100 and light that passes at angles through the microlens 130 is directed substantially consistently onto portions of the photodiode 100.

Figure 8:
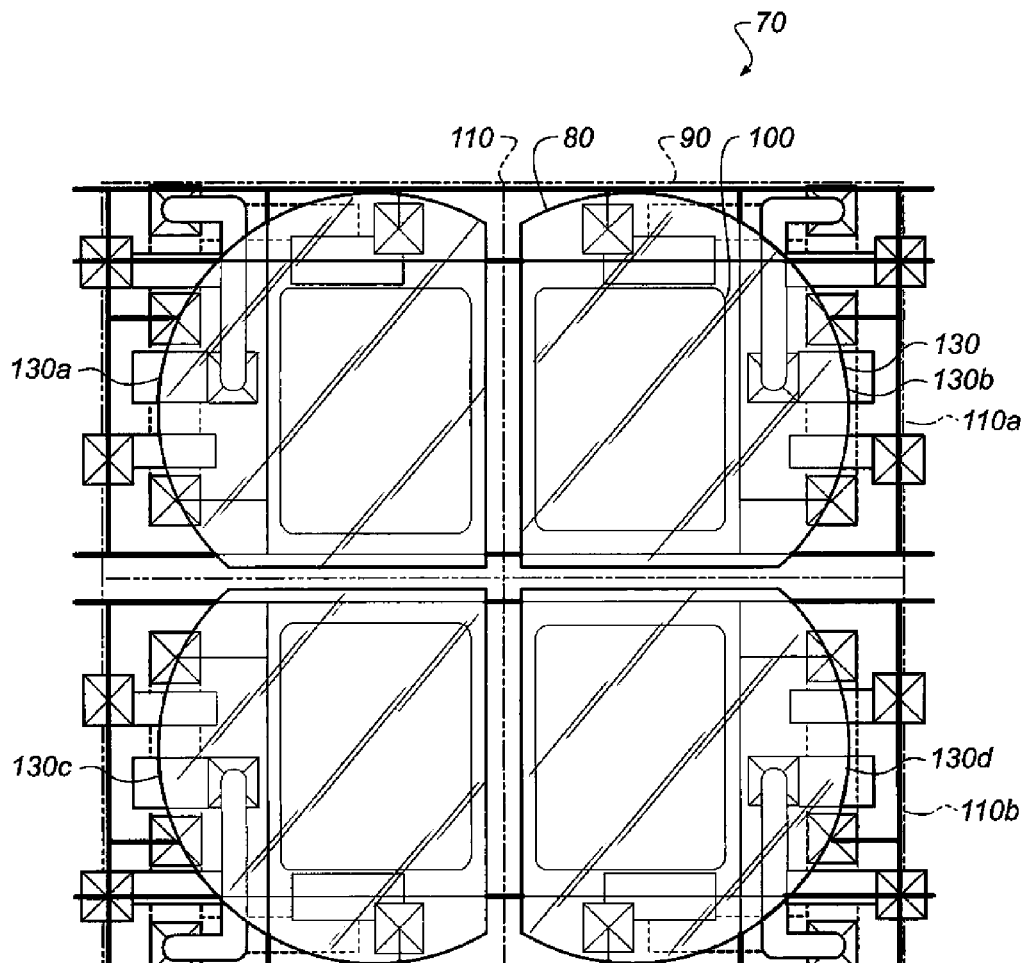
FIG. 8 is a top view of an alternative embodiment of FIG. 6 of the present invention.

As shown in FIG. 8, an alternative embodiment of the supercell 110 arrangement is shown. In this embodiment, there are four pixels 90 symmetrical around both imaginary x and y axes.

Figure 9:
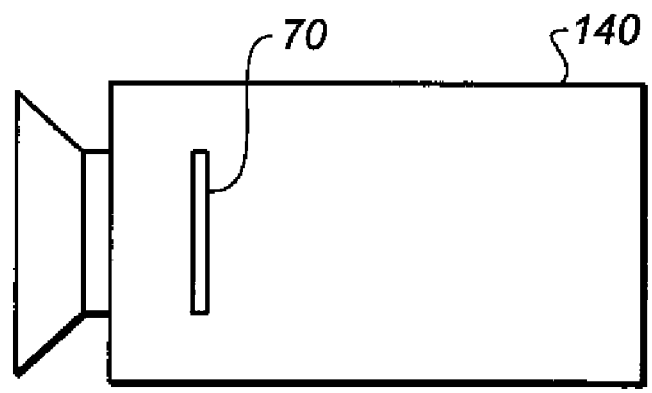
FIG. 9 is a side view of a digital camera containing the image sensor of the present invention.

Referring to FIG. 9, there is shown a side view of a digital camera 140 containing the image sensor 70 of the present invention for illustrating a typical commercial embodiment.

The invention has been described with reference to a preferred embodiment. However, it will be appreciated that variations and modifications can be effected by a person of ordinary skill in the art without departing from the scope of the invention.

PARTS LIST 10 image sensor
20 pixel
30 photosensitive area or photodiode
40 associated circuitry
50 regular grid pattern forming a supercell
60 microlens centered on photodiode
65 microlens centered on pixel
70 image sensor
80 array of microlenses
90 plurality of pixels
100 photosensitive area or photodiode
110 supercell of pixels
110a supercell
110b supercell
120 optical surface of microlens
130 microlens
130a microlens
130b microlens
130c microlens
130d microlens
140 digital camera

The invention claimed is:

1. An image sensor comprising:
    (a) a plurality of pixels each comprising a photosensitive site, wherein the plurality of pixels includes an asymmetrical arrangement of the photosensitive sites such that at least one distance in either an x direction or a y direction between individual photosensitive sites is not constant; and
    (b) a plurality of asymmetrical-shaped microlenses asymmetrically positioned over the photosensitive sites such that an optical axis of each microlens is aligned with a center of a respective photosensitive site; wherein incoming light is directed in a predetermined direction onto the respective photosensitive site by an asymmetrical surface of each microlens for capturing the light in a substantially uniform manner.

2. The image sensor as in claim 1, wherein the photosensitive sites are arranged into groups, each group forming a supercell that have a regular grid pattern.

3. The image sensor as in claim 1, wherein the asymmetrical shape includes a substantially arcuate-shaped portion along a peripheral edge and includes two substantially straight portions positioned substantially perpendicular to each other along a remaining edge.

4. The image sensor as in claim 2, wherein the asymmetrical shape includes a substantially arcuate-shaped portion along a peripheral edge and includes two substantially straight portions positioned substantially perpendicular to each other along a remaining edge.

5. The image sensor as in claim 3, wherein four asymmetrical-shaped microlenses are grouped spanning a supercell and a pair of straight portions, one from each microlens, are positioned facing each other so that a peripheral portion formed by the four microlenses is four arcuate-shaped edges.

6. The image sensor as in claim 3, wherein two asymmetrical-shaped microlenses are grouped spanning a supercell and a pair of straight portions, one from each microlens, are positioned so that a peripheral portion formed by the two microlenses is two arcuate-shaped edges and two straight edges.

7. A digital camera comprising:
    an image sensor comprising:
    (a) a plurality of pixels each comprising a photosensitive site, wherein the plurality of pixels includes an asymmetrically arrangement of the photosensitive sites such that at least one distance in either an x direction or a y direction between individual photosensitive sites is not constant; and
    (b) a plurality of asymmetrical-shaped microlenses asymmetrically positioned over the photosensitive sites such that an optical axis of each microlens is aligned with a center of a respective photosensitive site; wherein incoming light is directed in a predetermined direction onto respective photosensitive sites by an asymmetrical surface of each microlens for capturing the light in a substantially uniform manner.

8. The digital camera as in claim 7, wherein the photosensitive sites are arranged into groups, each group forming a supercell that have a regular grid pattern.

9. The digital camera as in claim 7, wherein the asymmetrical shape includes a substantially arcuate-shaped portion along a peripheral edge and includes two substantially straight portions positioned substantially perpendicular to each other along a remaining edge.

10. The digital camera as in claim 8, wherein the asymmetrical shape includes a substantially arcuate-shaped portion along a peripheral edge and includes two substantially straight portions positioned substantially perpendicular to each other along a remaining edge.

11. The digital camera as in claim 9, wherein four asymmetrical-shaped microlenses are grouped spanning a supercell and a pair of straight portions, one from each microlens, are positioned facing each other so that a peripheral portion formed by the four microlenses is four arcuate-shaped edges.

12. The digital camera as in claim 9, wherein two asymmetrical-shaped microlenses are grouped spanning a supercell and a pair of straight portions, one from each microlens, are positioned so that a peripheral portion formed by the two microlenses is two arcuate-shaped edges and two straight edges.

* * * * *